United States Patent
Krivokapic et al.

(10) Patent No.: US 6,855,583 B1
(45) Date of Patent: Feb. 15, 2005

(54) METHOD FOR FORMING TRI-GATE FINFET WITH MESA ISOLATION

(75) Inventors: Zoran Krivokapic, Santa Clara, CA (US); Judy Xilin An, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/633,503

(22) Filed: Aug. 5, 2003

(51) Int. Cl.[7] .................. H01L 21/00; H01L 21/336
(52) U.S. Cl. ........................ 438/157; 438/283
(58) Field of Search ................ 438/142, 151, 438/156, 157, 164, 182, 197, 212, 279, 283, 311, 517, 149, 152, 219, 268, 286, 579, 585–588, FOR 192, FOR 193; 257/308, 411, 412, 413, 437, E27.112, E21.32, E21.564, E21.561, E29.151, E29.273, E29.275

(56) References Cited

U.S. PATENT DOCUMENTS

| | | | | |
|---|---|---|---|---|
| 6,525,403 B2 | * | 2/2003 | Inaba et al. | 257/618 |
| 6,610,576 B2 | * | 8/2003 | Nowak | 438/301 |
| 6,657,252 B2 | * | 12/2003 | Fried et al. | 257/316 |
| 6,727,546 B2 | * | 4/2004 | Krivokapic et al. | 257/331 |
| 2004/0036126 A1 | * | 2/2004 | Chau et al. | 257/401 |

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.
Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET: PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—George Fourson
*Assistant Examiner*—Brook Kebede
(74) *Attorney, Agent, or Firm*—Harrity & Snyder, LLP

(57) ABSTRACT

A method forming a tri-gate fin field effect transistor includes forming an oxide layer over a silicon-on-insulator wafer comprising a silicon layer, and etching the silicon and oxide layers using a rectangular mask to form a mesa. The method further includes etching a portion of the mesa using a second mask to form a fin, forming a gate dielectric layer over the fin, and forming a tri-gate over the fin and the gate dielectric layer.

19 Claims, 21 Drawing Sheets

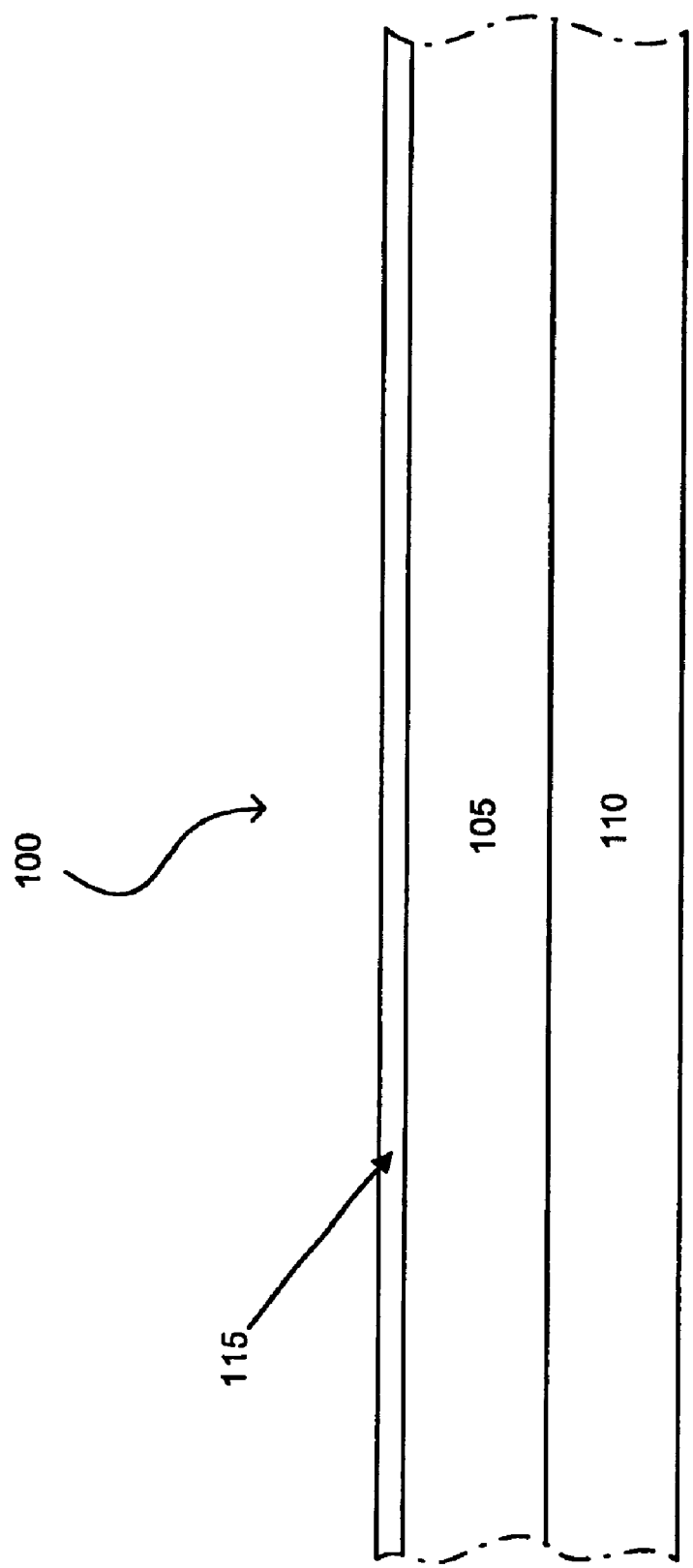

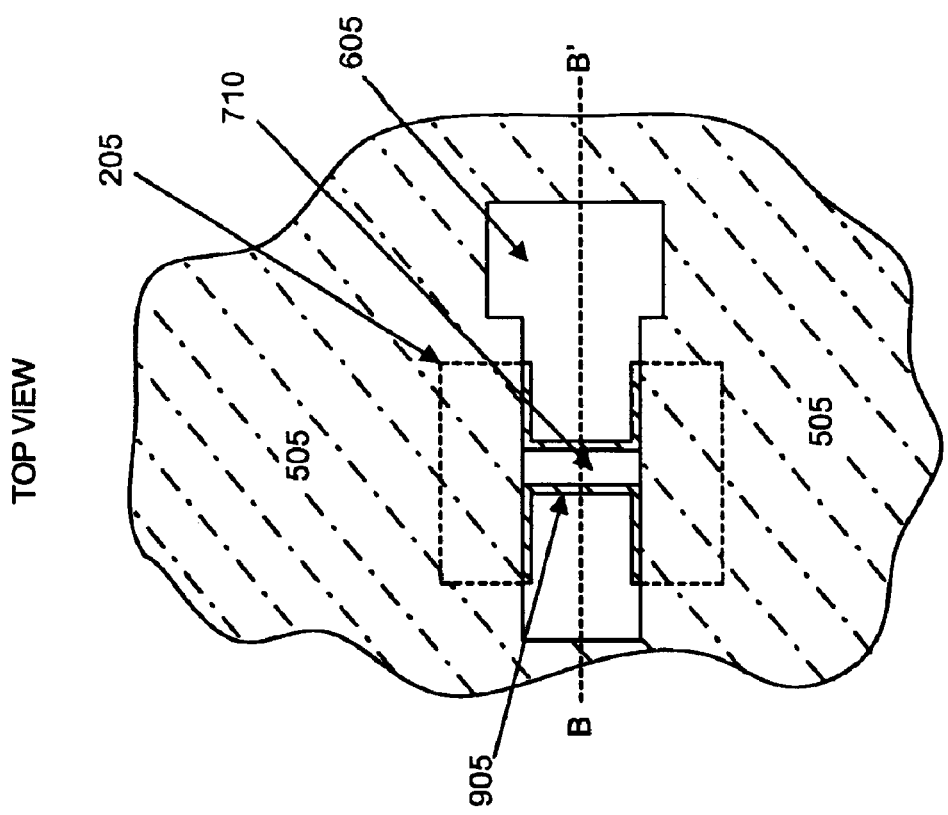
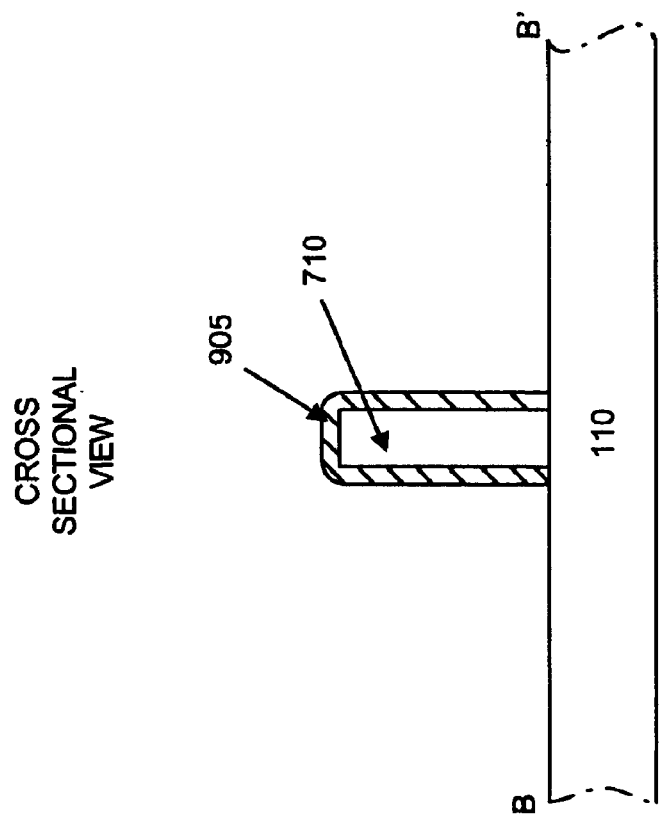
FIG. 9B
FIG. 9A

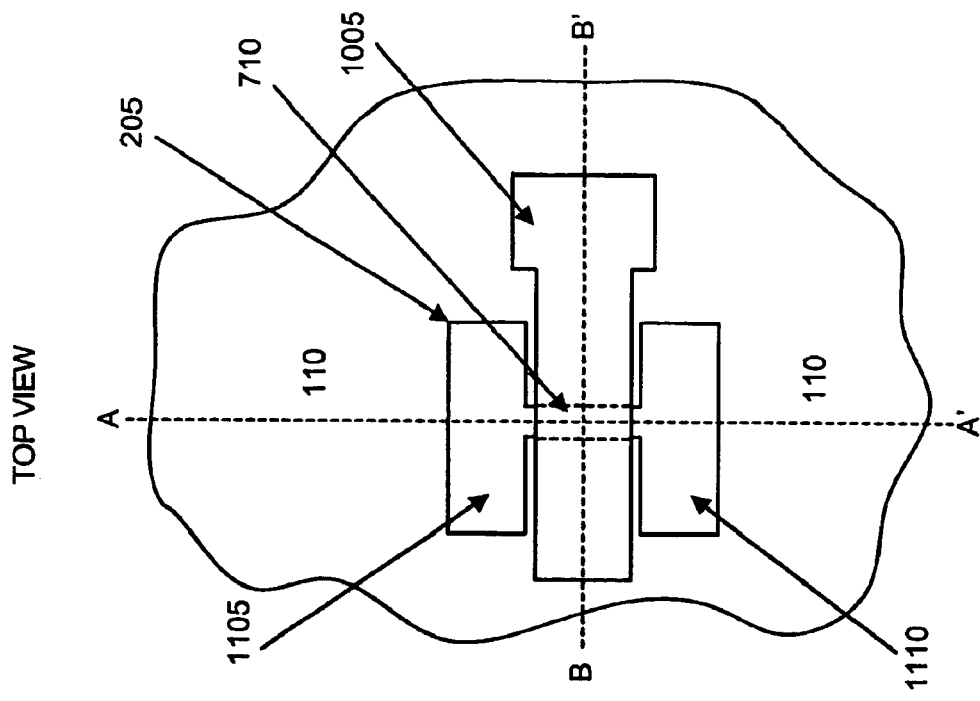
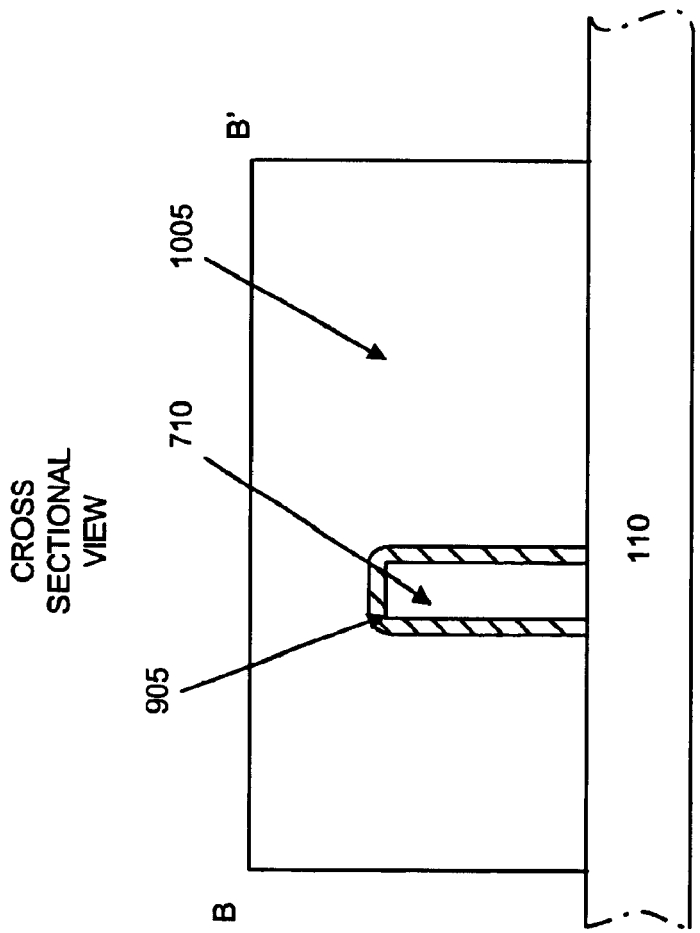
FIG. 11A
FIG. 11B

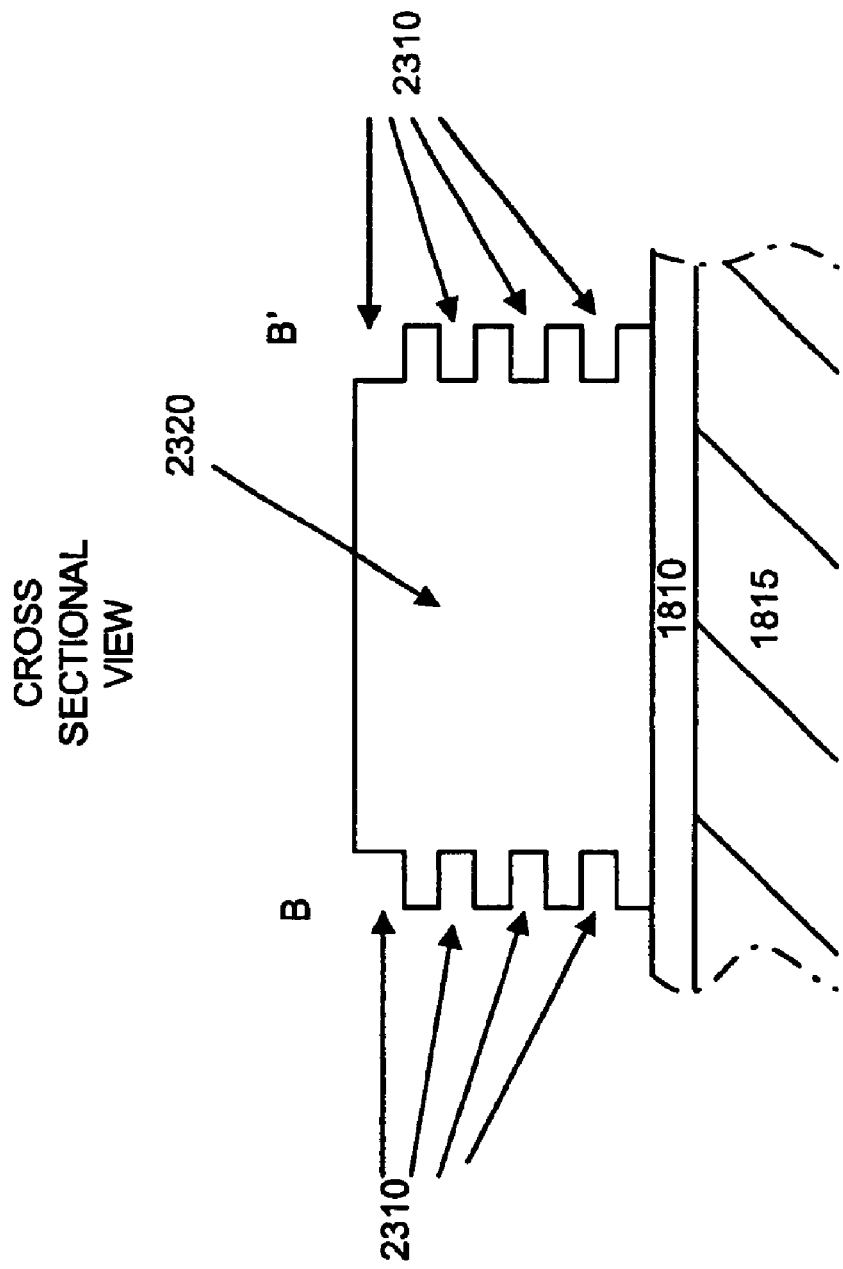

METHOD FOR FORMING TRI-GATE FINFET WITH MESA ISOLATION

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a tri-gate FinFET formed using fully depleted silicon-on-insulator (FDSOI) mesa isolation. A tri-gate FinFET will have better short-channel control than double-gate and single-gate devices, and will have higher drive current than a double-gate FinFET for the same area.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a fin field effect transistor that includes forming a mesa on a silicon-on-insulator wafer, forming a dummy gate with a first material in a first pattern over the mesa, and forming a first dielectric layer around the dummy gate. The method further includes removing the first material to create a trench shaped in the first pattern, forming a mask over a portion of the trench and the mesa, and etching a portion of the mesa that is exposed within the trench to form a fin. The method also includes forming a gate dielectric layer over the fin, forming a gate within the trench over the gate dielectric layer, and removing the first dielectric layer.

According to another aspect of the invention, a method of forming a tri-gate fin field effect transistor is provided. The method includes forming an oxide layer over a silicon-on-insulator wafer comprising a silicon layer, etching the silicon and oxide layers using a rectangular mask to form a mesa, and etching a portion of the mesa using a second mask to form a fin. The method further includes forming a gate dielectric layer over the fin and forming a tri-gate over the fin and the gate dielectric layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 1 illustrates exemplary layers of a fully depleted silicon-on-insulator (FDSOI) wafer that may be used for forming portions of a FinFET consistent with the present invention;

FIGS. 9A and 9B illustrate the formation of an exemplary gate dielectric layer in the trench of FIG. 6 consistent with the invention;

FIGS. 11A, 11B and 11C illustrate the removal of portions of the dielectric layer of FIGS. 10A, 10B and 10C consistent with the invention;

FIGS. 23A, 23B and 23C illustrate the formation of nano-wires by removal of one of the alternating layers of dissimilar semiconducting materials of FIGS. 22A and 22B consistent with a further embodiment of the invention.

BEST MODE FOR CARRYING OUT THE INVENTION

Figure 2B:
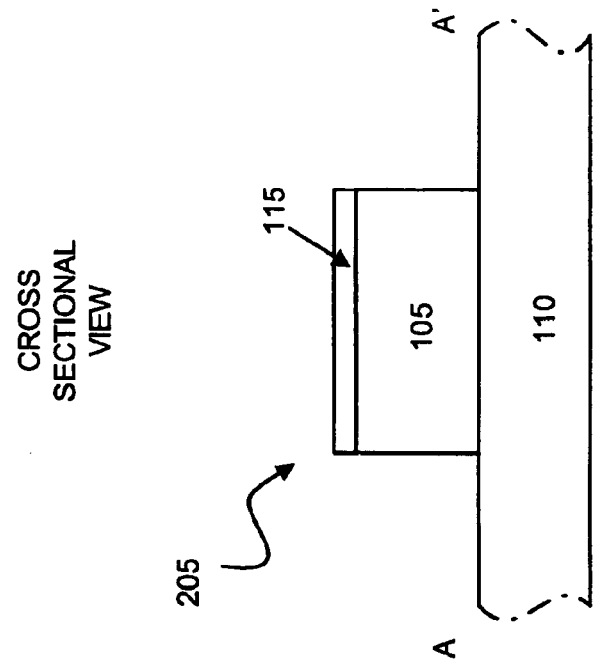
FIGS. 2A and 2B illustrate an exemplary mesa formed consistent with the invention.

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an exemplary process for forming a tri-gate FinFET is provided. The exemplary process forms a silicon mesa on a FDSOI wafer. A dummy gate that may include, for example, $Si_3N_4$, may be formed over the mesa and a layer of tetraethylorthosilicate (TEOS), or any other dielectric material, may then be formed over the mesa and the dummy gate. The dummy gate may then be removed, leaving a trench in the shape of the eventual gate and an active mask may be used to etch a fin channel in exposed portions of the mesa within the trench. A gate may then be formed in the trench over the fin to produce a tri-gate FinFET.

FIG. 1 illustrates a cross-section of a FDSOI wafer 100 formed in accordance with an exemplary embodiment of the present invention. FDSOI wafer 100, consistent with the present invention, may include a layer of semiconducting material 105 formed on a layer of oxide 110. The layer of semiconducting material 105 may include, for example, silicon, germanium or silicon-germanium, and may range, for example, from about 10 nm to about 50 nm in thickness. Layer 105 may be used to form a fin for a FinFET device as described in more detail below. Oxide layer 110 may be formed on a substrate comprising silicon, germanium or silicon-germanium (not shown). Oxide layer 110 may include, for example, silicon dioxide ($SiO_2$), though other oxide materials may be used. Another oxide layer 115 may be deposited or thermally grown on layer 105. Oxide layer 115 may include, for example, silicon dioxide ($SiO_2$), though other oxide materials may be used. Oxide layer 115 may range, for example, from about 10 to about 15 nm in thickness.

Figure 2A:
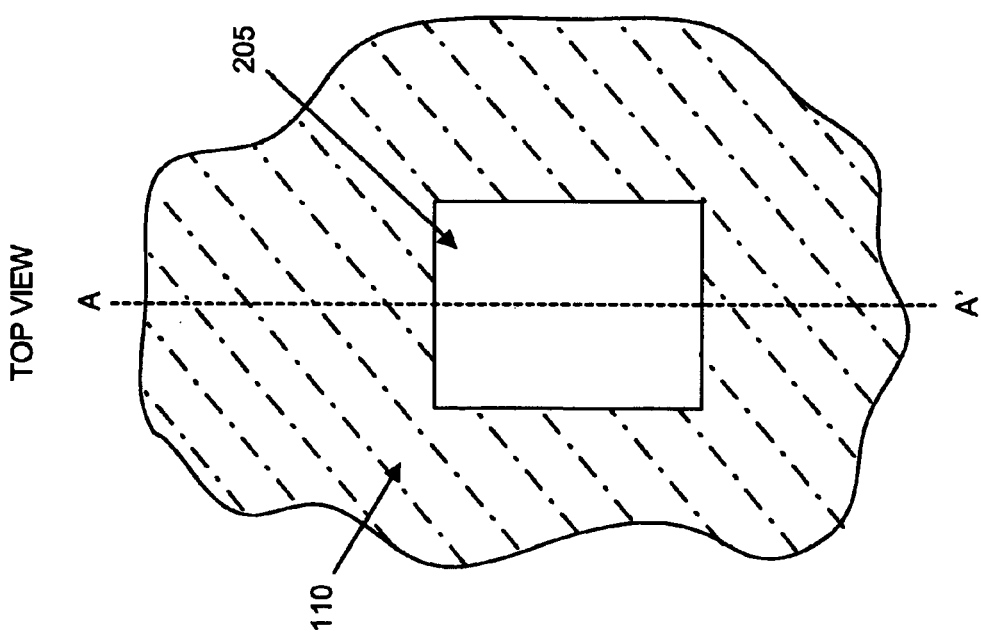
Figure 3:
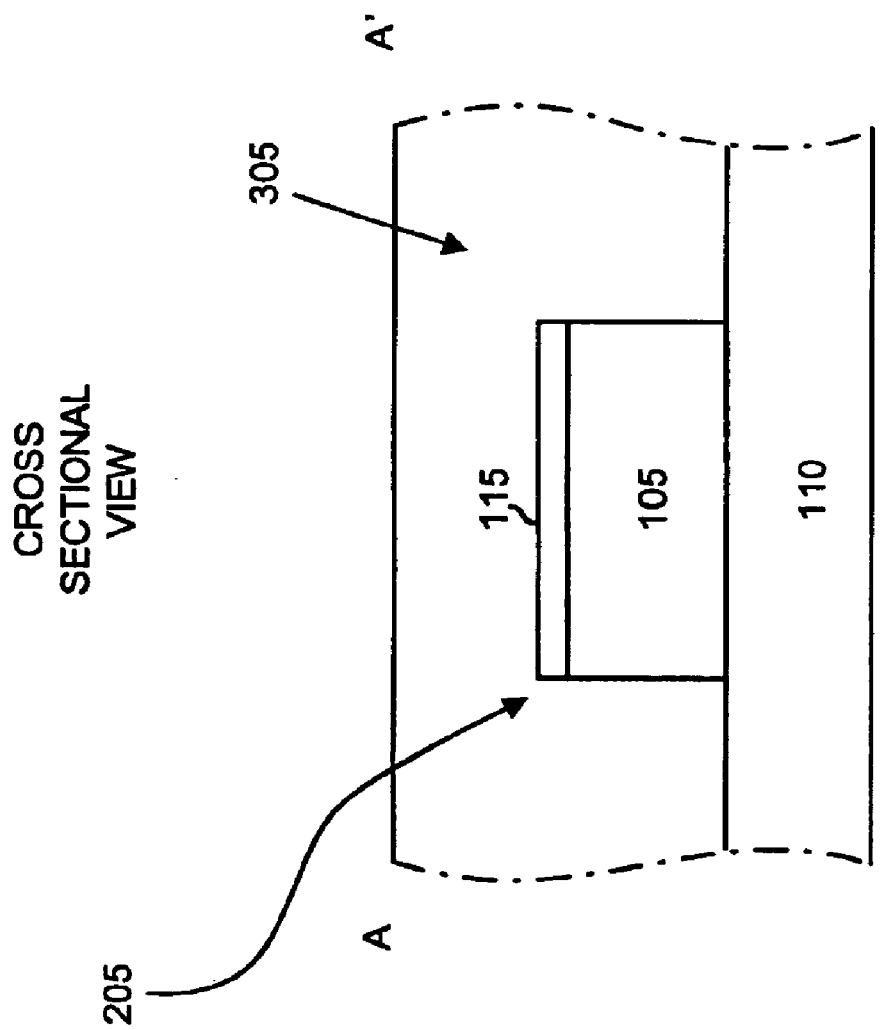
FIG. 3 illustrates an exemplary layer of $Si_3N_4$ formed over the mesa of FIGS. 2A and 2B consistent with the invention.
Figure 4B:
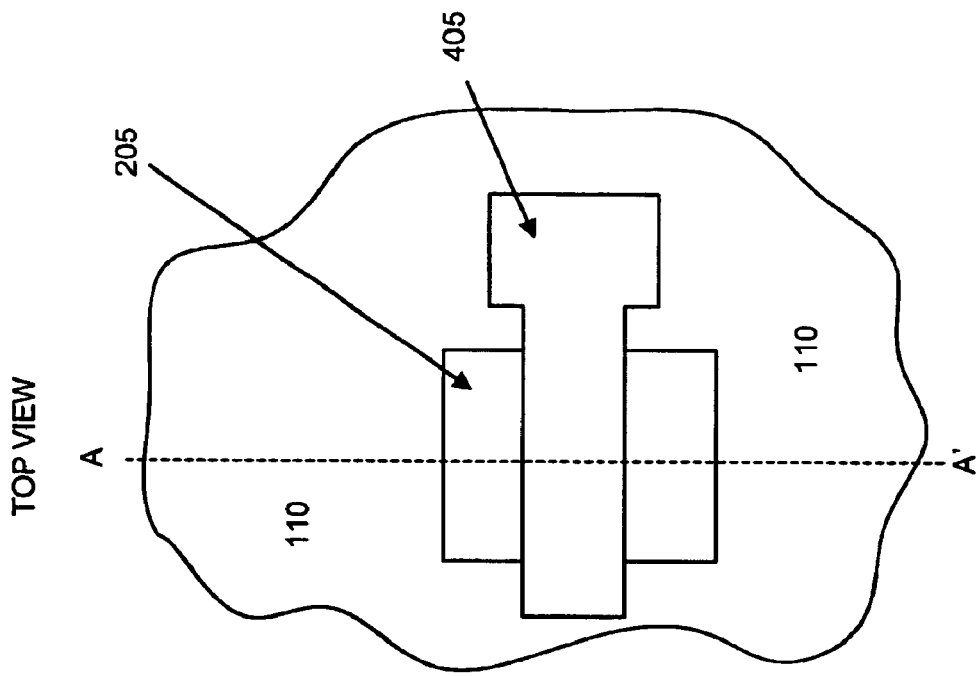
FIGS. 4A and 4B illustrate an exemplary dummy gate formed from the $Si_3N_4$ layer of FIG. 3 consistent with the invention.
Figure 4A:
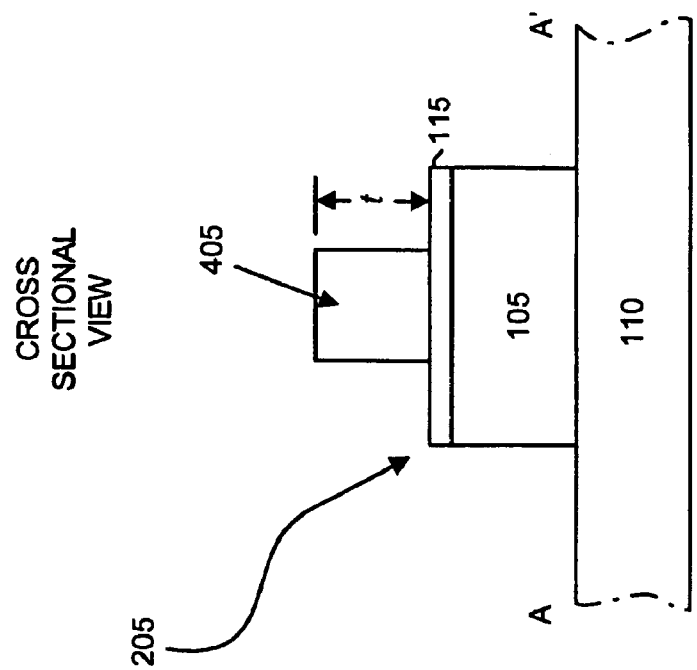

As shown in FIGS. 2A and 2B, a mesa 205 may be formed from layers 105 and 115. Mesa 205 may be formed, for example, using a rectangular active mask and conventional etching processes. For example, a conventional photoresist material may be patterned and etched to define a rectangular mask having dimensions ranging from about 200 nm to 1000 m in length and about 80 nm to about 250 nm in width. The areas not covered by the mask may then be etched, with the etching terminating on oxide layer 110. The photoresist material may then be removed. A layer 305 of material, such as, for example, $Si_3N_4$, may then be formed over mesa 205, as shown in FIG. 3. Layer 305 may be formed over mesa 205 using a conventional process, such as, for example, a conventional chemical-vapor deposition (CVD) process, and, then planarized using, for example, a conventional chemical-mechanical polishing (CMP) process. As further shown in FIGS. 4A and 4B, a dummy gate 405 may be formed from layer 305. Dummy gate 405 may be formed, for example, using conventional photolithographic and etching processes. The thickness t of the portion of dummy gate 405 located over mesa 205 may range, for example, from about 80 nm to about 120 nm. The portion of dummy gate 405 located over mesa 205, as shown in FIG. 4A, may be located over a channel region of a fin subsequently formed from mesa 205 (as further described below).

Figure 6:
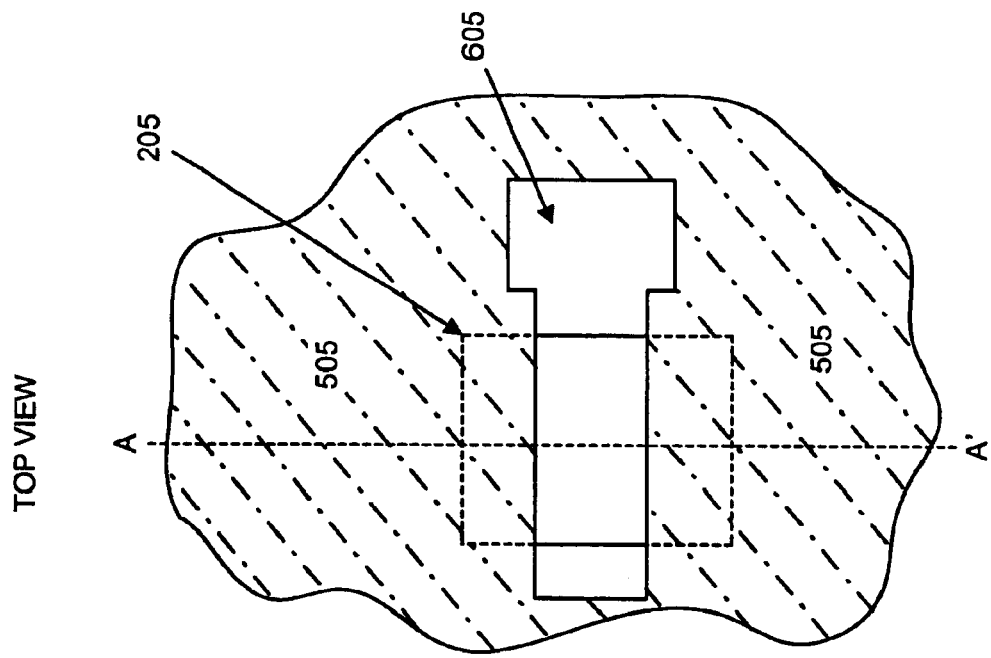
FIG. 6 illustrates the removal of the dummy gate material of FIG. 5 consistent with the invention.
Figure 5:
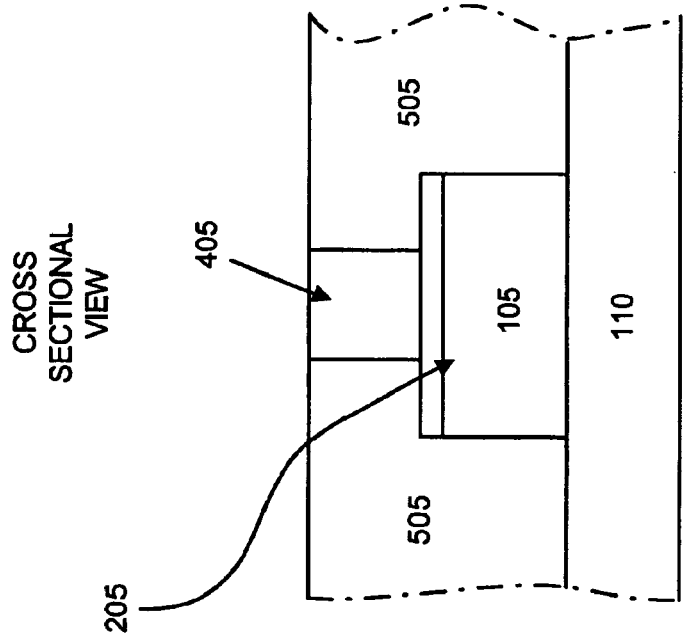
FIG. 5 illustrates the formation of a dielectric layer over the dummy gate and mesa of FIGS. 4A and 4B consistent with the invention.
Figure 7B:
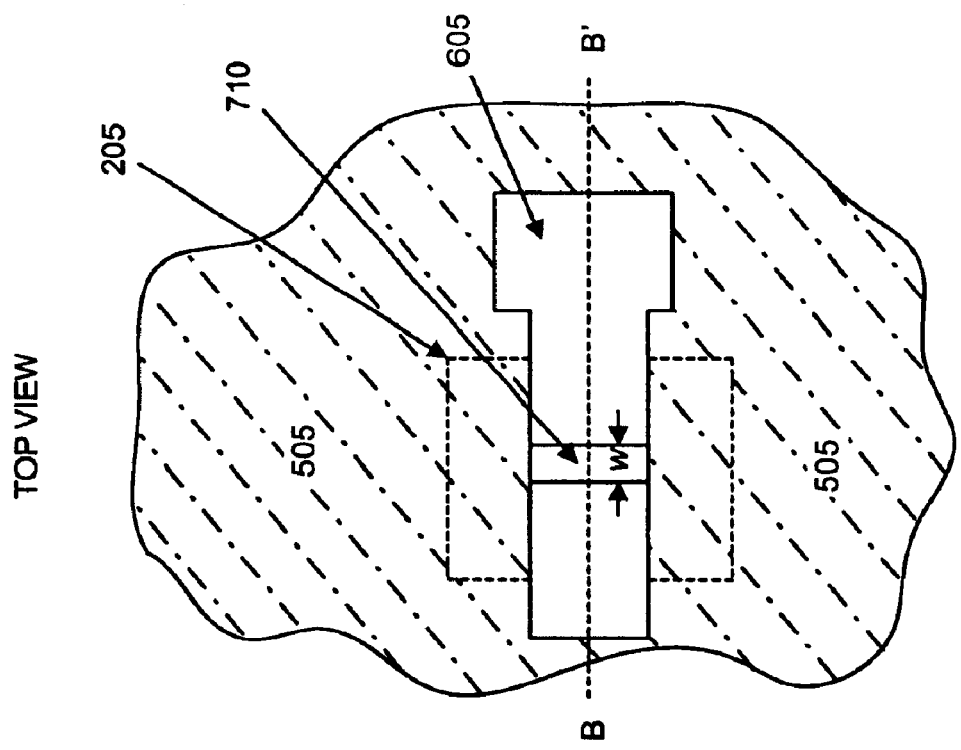
FIGS. 7A and 7B illustrate the use of an active mask to etch a fin within the mesa of FIG. 6 consistent with the invention.
Figure 7A:
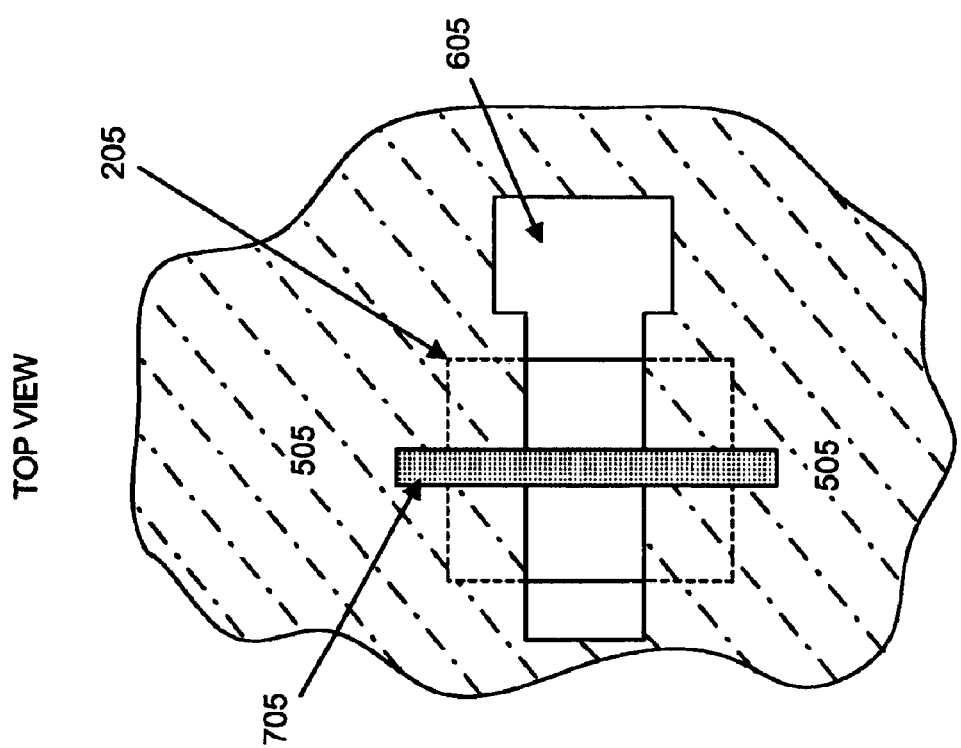

A layer 505 of tetraethylorthosilicate (TEOS), or any other dielectric material, may then be formed over mesa 205 and dummy gate 405. Layer 505 may then be polished back to expose the upper surface of dummy gate 405 using, for example, a CMP process, as illustrated in FIG. 5. As shown in FIG. 6, dummy gate 405 may be removed leaving a gate trench 605. Dummy gate 405 may be removed, for example, using a conventional etching process. As further shown in FIGS. 7A and 7B, an active mask 705 may be formed over mesa 205. Mask 705 may be formed using a conventional photoresist material and its length may extend about 100 nm beyond mesa 205 on each end and its width may range from about 15 nm to about 30 nm after photoresist trimming. Mask 705 may be used to remove portions of mesa 205 exposed in gate trench 605 to create fin 710. For example, the portions of mesa 205 not covered by mask 705 may be etched to form fin 710 that may comprise a channel region for the final tri-gate FinFET. Fin 710 may have a width, w, ranging, for example, from about 15 nm to about 30 nm. Mask 705 may then be removed.

Figure 8B:
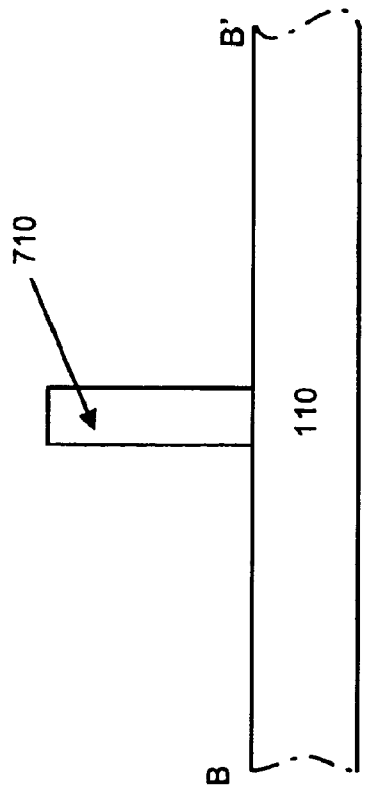
FIGS. 8A and 8B illustrate the formation, and removal, of a sacrificial oxide layer from the fin of FIGS. 7A and 7B consistent with the invention.
Figure 8A:
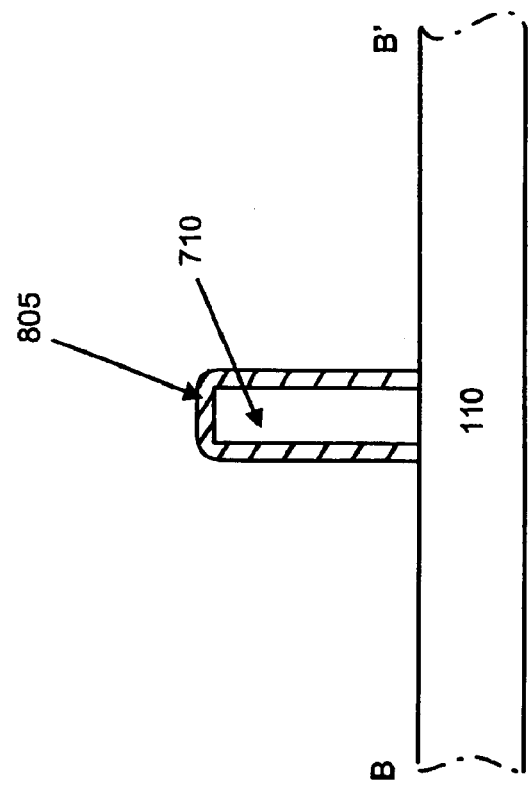

As shown in FIG. 8A, a layer 805 of sacrificial oxide may be formed over fin 710. Sacrificial oxide layer 805 may be formed on fin 710 using any conventional process. In some exemplary embodiments, for example, sacrificial oxide layer 805 may be thermally grown on fin 710. As further shown in FIG. 8B, sacrificial oxide layer 805 may be removed using a conventional process, such as, for example, a conventional etching process, to remove defects from sidewalls of fin 710.

Figure 10B:
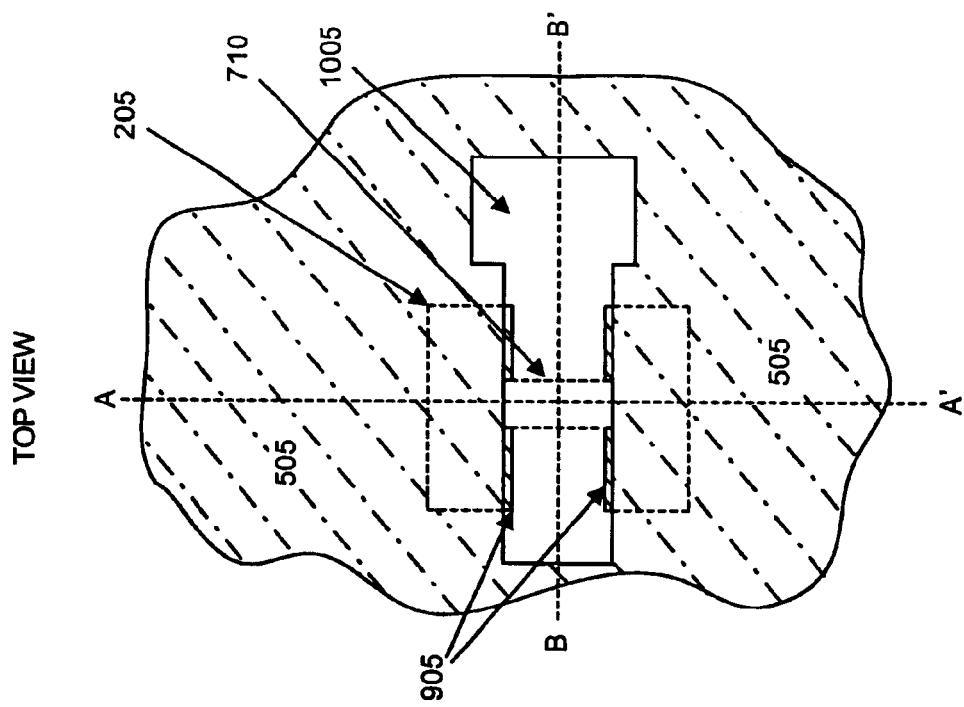
FIGS. 10A, 10B and 10C illustrate the formation of an exemplary gate within the trench of FIGS. 9A and 9B consistent with the invention.
Figure 10A:
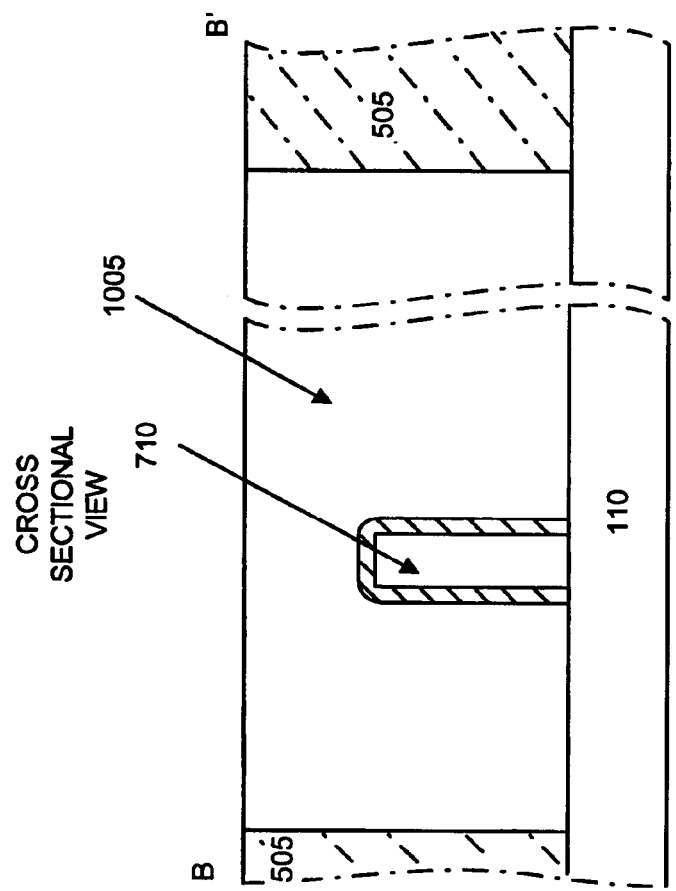
Figure 10C:
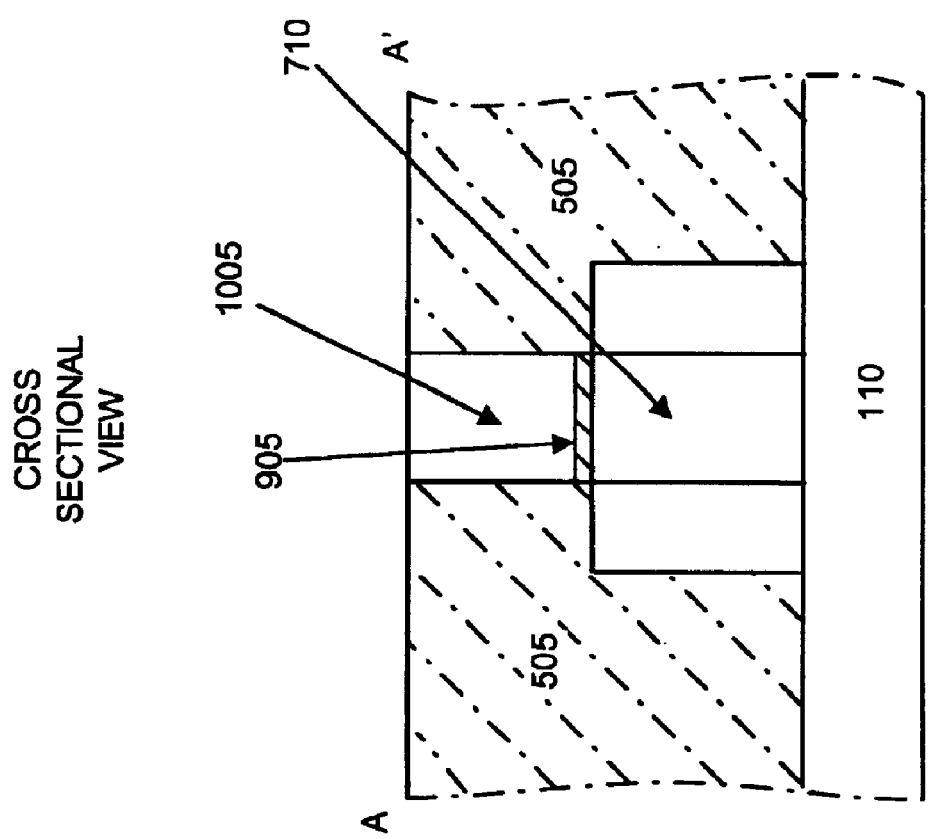

A gate dielectric 905 may then be formed on surfaces of fin 710 and exposed sidewalls of mesa 205 within gate trench 605, as shown in FIGS. 9A and 9B. Gate dielectric 905 may be thermally grown or deposited using conventional processes. Gate dielectric 905 may include SiO, $SiO_2$, SiN, SiON, $HF_{02}$, $ZrO_2$, $Al_2O_3$, HfSiO(x), HfSiO(x)N(1-x) an oxide/nitride stack, or other high-K dielectric materials. A gate 1005 may then be formed in gate trench 605, as shown in FIGS. 10A, 10B and 10C. Gate 1005 may include, for example, polysilicon or a metal, that may be deposited in gate trench 605 and then polished back to the upper surface of TEOS layer 505 using, for example, a conventional CMP process.

Figure 11C:
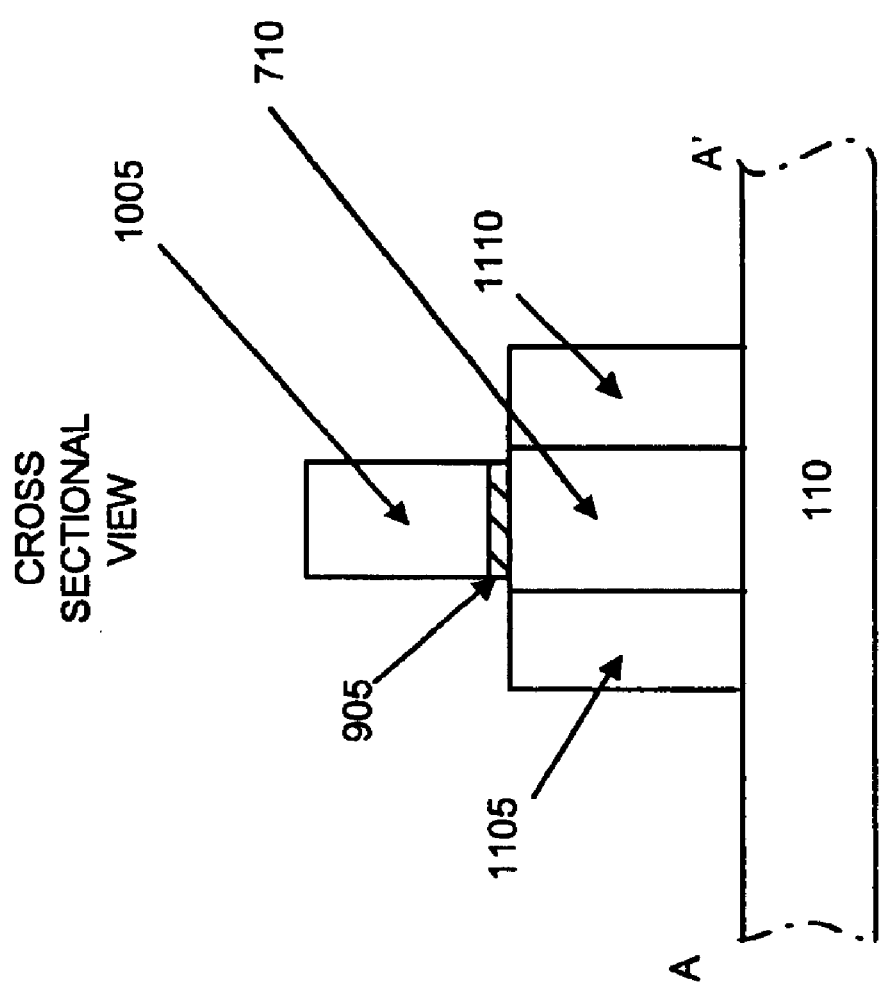

TEOS layer 505 and exposed portions of gate dielectric 905 may then be removed, stopping on mesa 205, to expose oxide layer 110, as shown in FIGS. 11A, 11B and 11C. TEOS layer 505 and exposed portions of gate dielectric 905 may be removed, for example, using conventional etching processes. Source 1105 and drain 1110 regions may then be formed from exposed portions of mesa 205 to complete the tri-gate FinFET formation process. As shown in FIG. 11A, the resulting gate 1005 is disposed on three sides of fin 710 (i.e., over the top surface of fin 710 and adjacent both side surfaces of fin 710), thus, producing a tri-gate FinFET. The tri-gate FinFET, consistent with the invention, will have better short-channel control than double-gate and single-gate devices and will have higher drive current than a double-gate FinFET for the same area.

Exemplary Process for Forming a Strained FinFET Fin Using Epitaxial Regrowth

Figure 12:
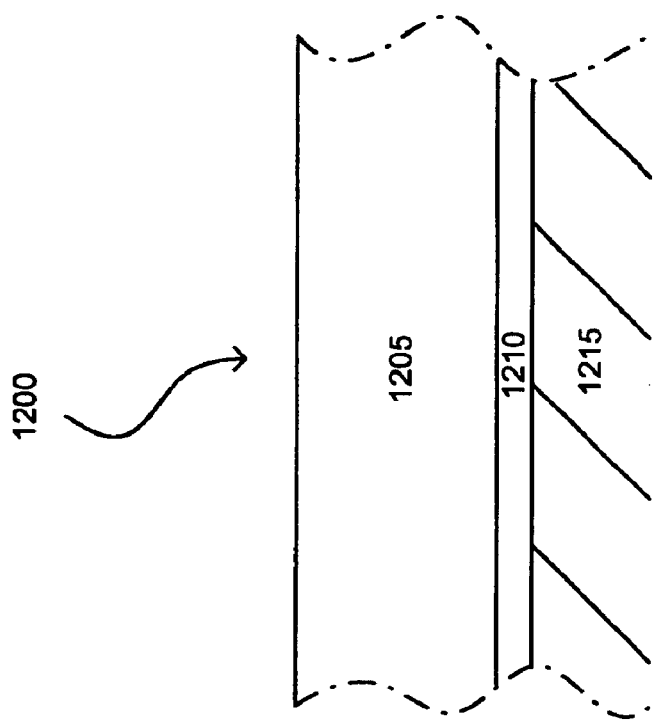
FIG. 12 illustrates seed, oxide and buried oxide layers used to form a strained fin using epitaxial regrowth consistent with another embodiment of the invention.

FIGS. 12–17 illustrate an exemplary process for forming a strained FinFET fin using an epitaxial regrowth process consistent with another embodiment of the invention. As shown in FIG. 12, the exemplary process may begin with the formation of a seed layer 1210 and an oxide layer 1205 on a buried oxide (BOX) layer 1215. Seed layer 1210 may include, for example, germanium (Ge), though other semiconducting materials may be used, and may be formed using, for example, conventional deposition processes. Seed layer 1210 may range, for example, from about 200 Å to about 1000 Å in thickness. Oxide layer 1205 may include, for example, SiO or $SiO_2$, though other oxide materials may be used, and may be formed, for example, from a conventional CVD process. Oxide layer 1205 may range, for example, from about 800 Å to about 1200 Å in thickness.

Figure 13:
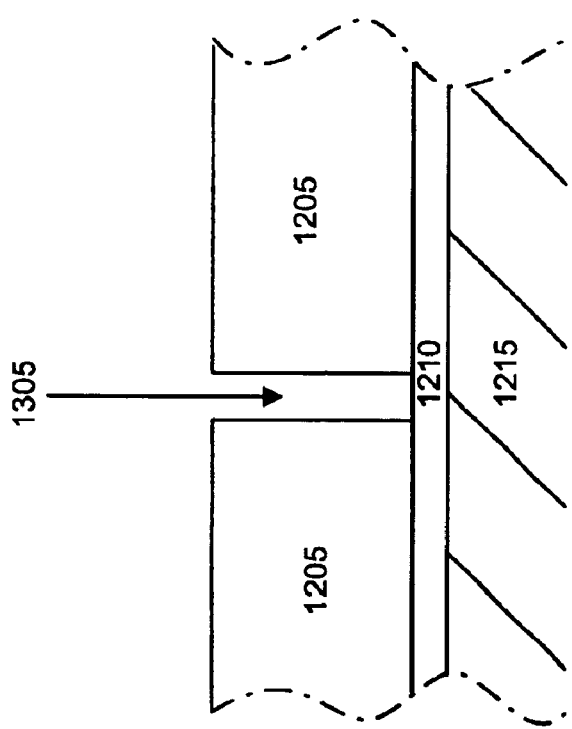
FIG. 13 illustrates the formation of a trench within the oxide layer of FIG. 12 consistent with another embodiment of the invention.
Figure 15:
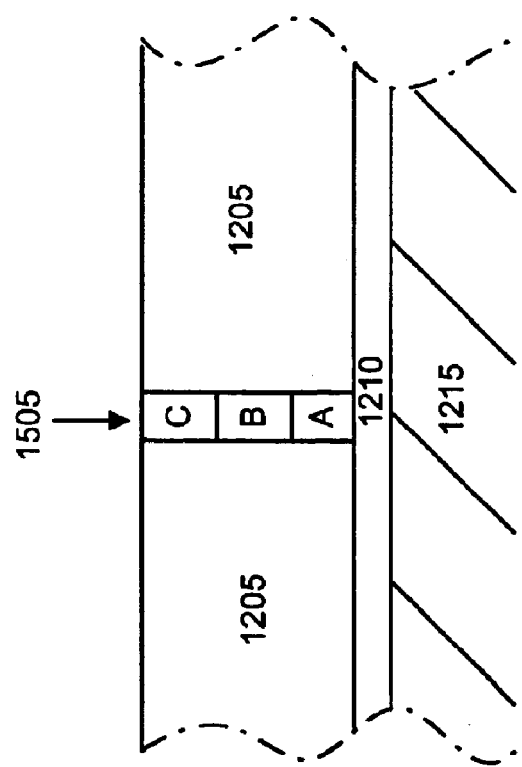
FIG. 15 illustrates the polishing of excess growth of the strained semiconducting layer of FIG. 14 consistent with another embodiment of the invention.
Figure 14:
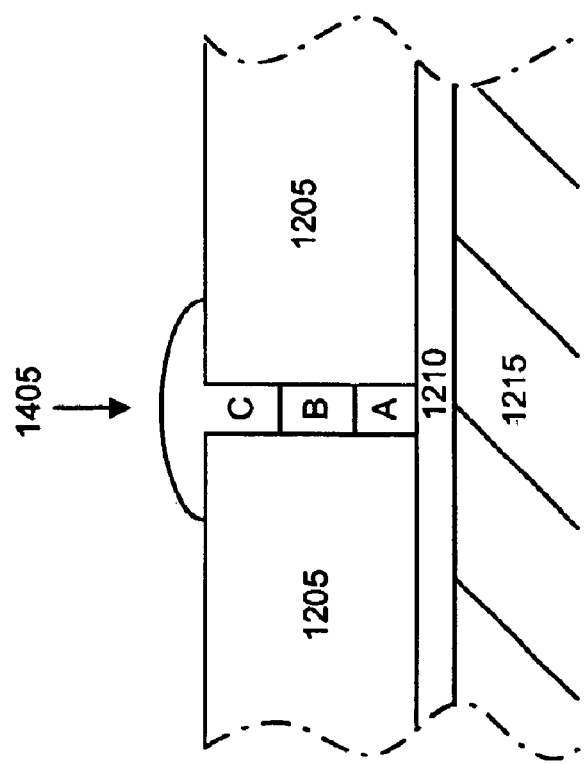
FIG. 14 illustrates the formation of a strained semiconducting layer within the trench of FIG. 13 consistent with another embodiment of the invention.

As shown in FIG. 13, a trench 1305 may be formed in oxide layer 1205 using, for example, conventional photolithographic and etching processes. Trench 1305 may range, for example, from about 500 Å to about 5000 Å in width. As further shown in FIG. 14, a strained semiconducting layer 1405 may then be grown in trench 1305 using, for example, selective epitaxy. Growth of layer 1405 may start from $Si_xGe_{1-x}$ (at "A") and progress to silicon (at "C"). After growth of layer 1405, excess growth may be polished off using, for example, a conventional CMP process, to form fin 1505, as shown in FIG. 15.

Figure 17:
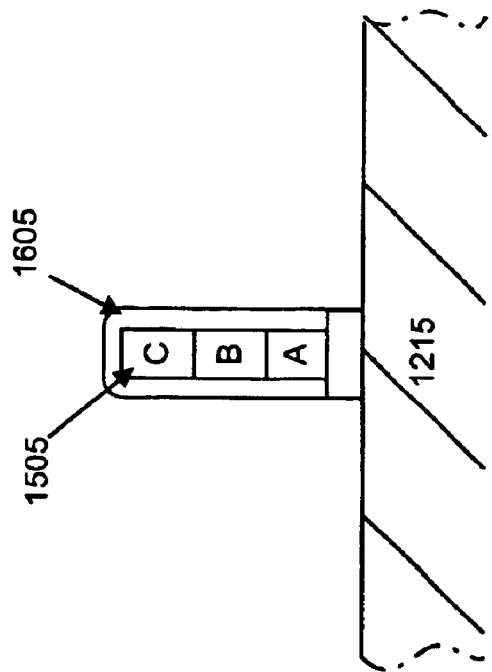
FIG. 17 illustrates etching of the seed layer of FIG. 16 consistent with another embodiment of the invention.
Figure 16:
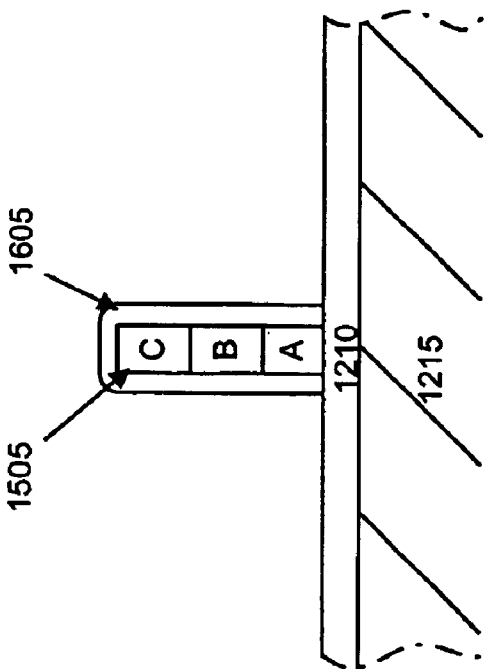
FIG. 16 illustrates the formation of a fin spacer consistent with another embodiment of the invention.

As further shown in FIG. 16, oxide layer 1205 may be removed using, for example, a conventional etching process to form a strained fin 1505. A spacer 1605 may then be formed over strained fin 1505. Spacer 1605 may include a dielectric material, such as, for example, SiO, $SiO_2$, SiN, SiON, $HfO_2$, $ZrO_2$, $Al_2O_3$, HfSiO(x), or HfSiO(x)N(1-x) and may range, for example, from about 10 Å to about 40 Å in thickness. Seed layer 1210 may then be etched away, as shown in FIG. 17. Tensile strain in fin 1505, that is due to confinement from seed layer 1210, improves carrier mobility of the FinFET.

Exemplary FinFET Nano-Wire Formation by Selective EPI of Dissimilar Semiconductors FIGS. 18–23 illustrate an exemplary process for forming multiple channel "nano-wires" in a fin of a FinFET consistent with a further embodiment of the invention. The formation of multiple channel nano-wires, having extremely small vertical and horizontal dimensions, can be very difficult. The exemplary process described with respect to FIGS. 18–23 enables the formation of such structures.

Figure 18:
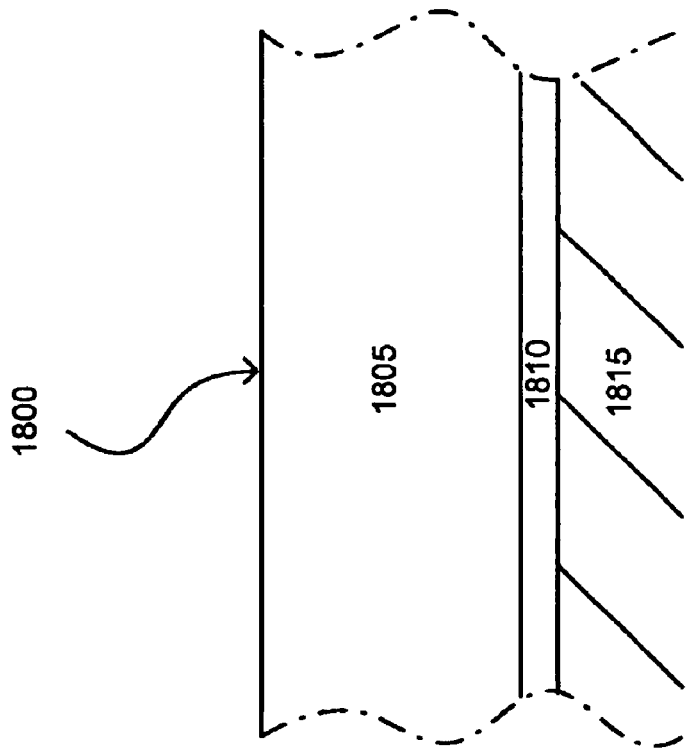
FIG. 18 illustrates seed, oxide and buried oxide layers used for nano-wire formation via selective epitaxy of dissimilar semiconductors consistent with a further embodiment of the invention.

As shown in FIG. 18, the exemplary process may begin with the formation of a seed layer 1810 and an oxide layer 1805 on a buried oxide (BOX) layer 1815. Seed layer 1810 may include, for example, silicon, though other semiconducting materials may be used, and may be formed using, for example, conventional deposition processes. Seed layer 1810 may range, for example, from about 200 Å to about 500 Å in thickness. Oxide layer 1805 may include, for example, SiO or $SiO_2$, though other oxide materials may be used, and may be formed, for example, from a conventional CVD process. Oxide layer 1805 may range, for example, from about 800 Å to about 1200 Å in thickness.

Figure 19:
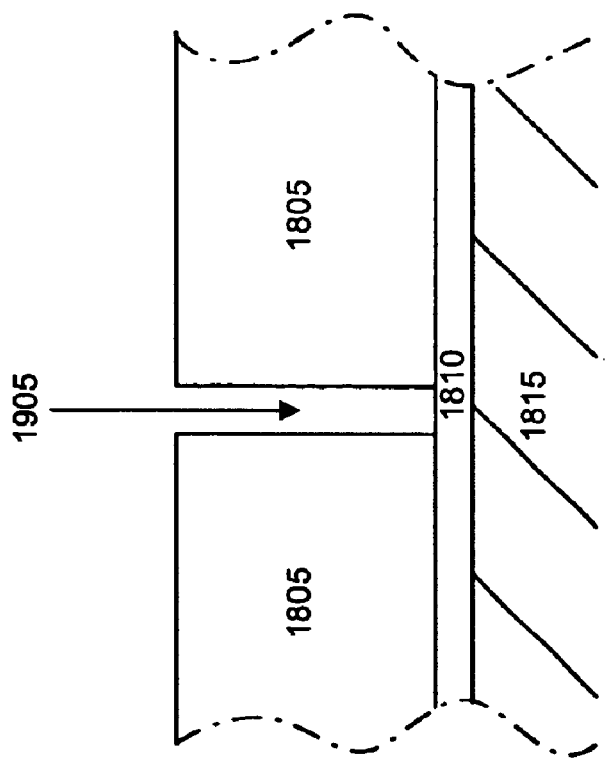
FIG. 19 illustrates the formation of a trench within the oxide layer of FIG. 18 consistent with a further embodiment of the invention.
Figure 20:
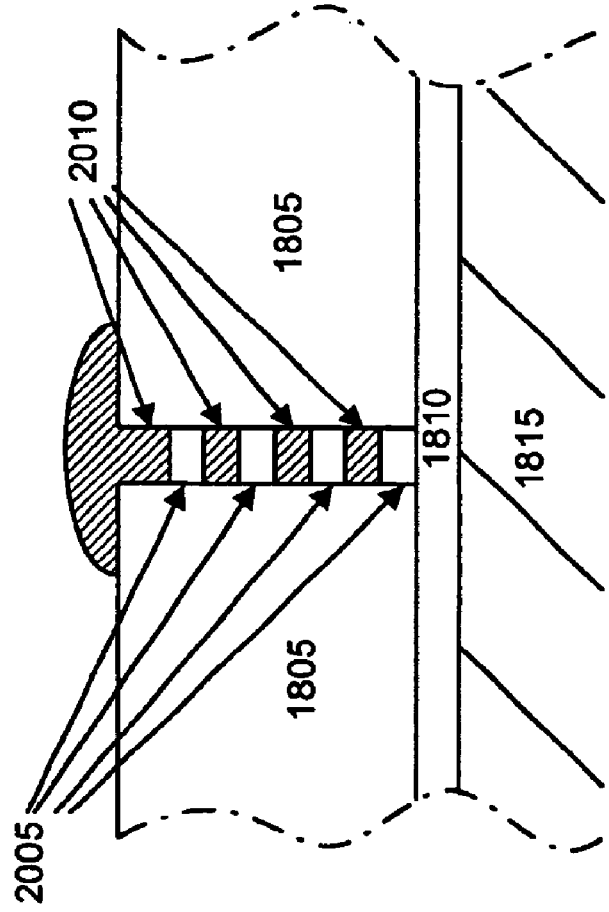
FIG. 20 illustrates the formation of alternating layers of different semiconducting materials in the trench of FIG. 19 consistent with a further embodiment of the invention.
Figure 21B:
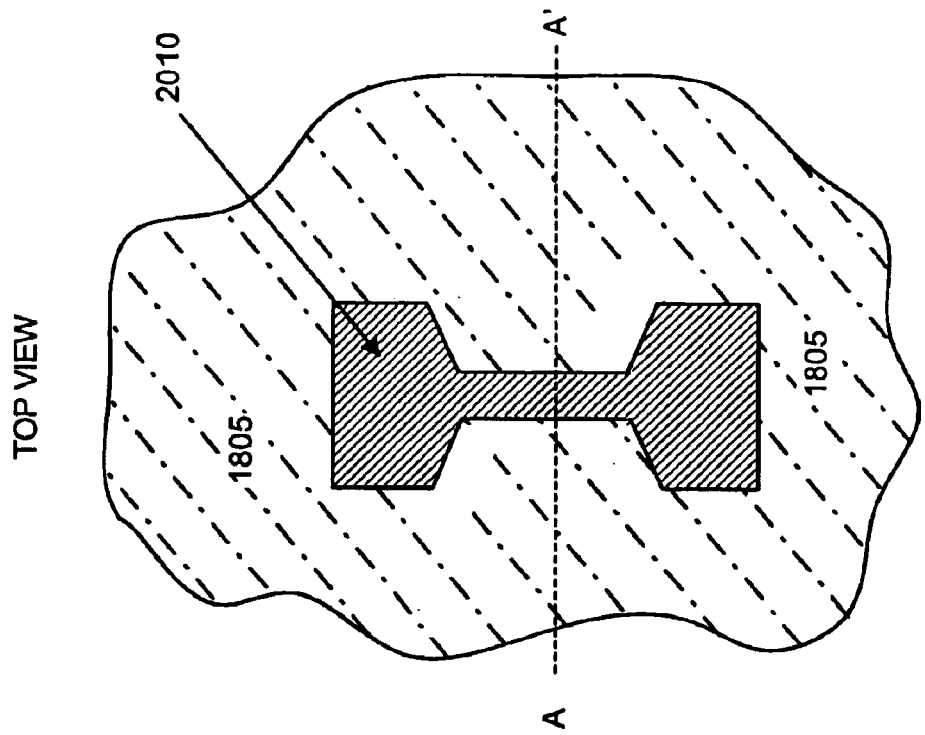
FIGS. 21A and 21B illustrate the polishing of excess material from the topmost layer of the alternating layers of FIG. 20 consistent with a further embodiment of the invention.
Figure 21A:
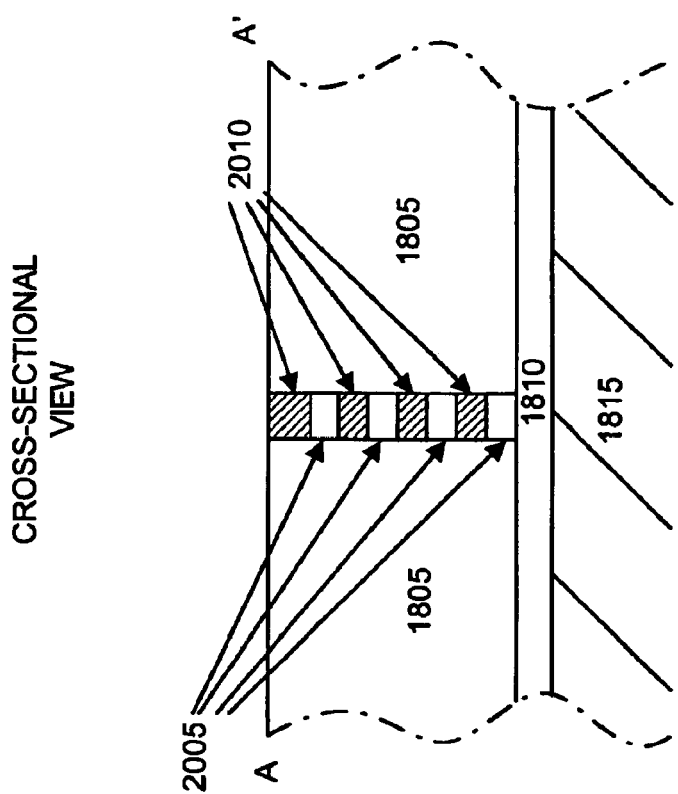

As shown in FIG. 19, a trench 1905 may be formed in oxide layer 1805 using, for example, conventional photolithographic and etching processes. Trench 1905 may range, for example, from about 500 Å to about 2500 Å in width. Alternating layers of different semiconducting materials may then be grown in trench 1905 using, for example, selective epitaxy, as shown in FIG. 20. Two different semiconducting materials 2005 and 2010 may be grown, for example, in trench 1905. Semiconducting material 2005 may include silicon, for example, and semiconducting material 2010 may include germanium, for example. One skilled in the art will recognize that other semiconducting materials may be used for the different semiconducting materials 2005 and 2010. As further shown in FIGS. 21A and 21B, the excess material of the topmost layer of semiconducting material 2010 may be polished off using, for example, a conventional CMP process, thereby forming a planar top surface.

Figure 22B:
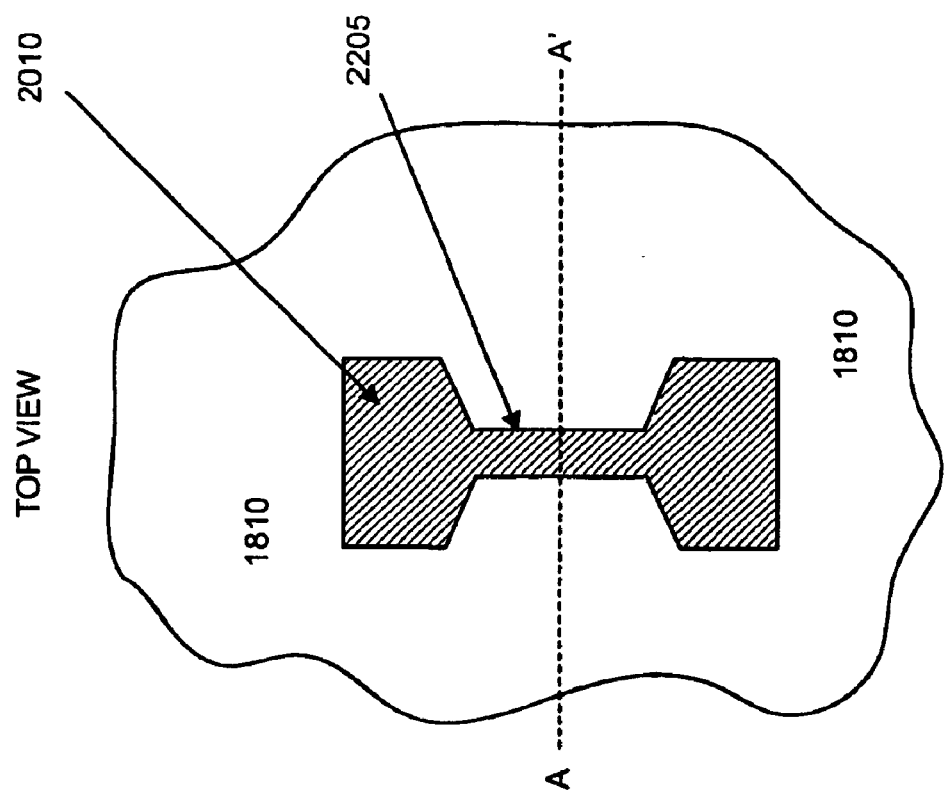
FIGS. 22A and 22B illustrate the removal of the oxide layer of FIGS. 21A and 21B consistent with a further embodiment of the invention.
Figure 22A:
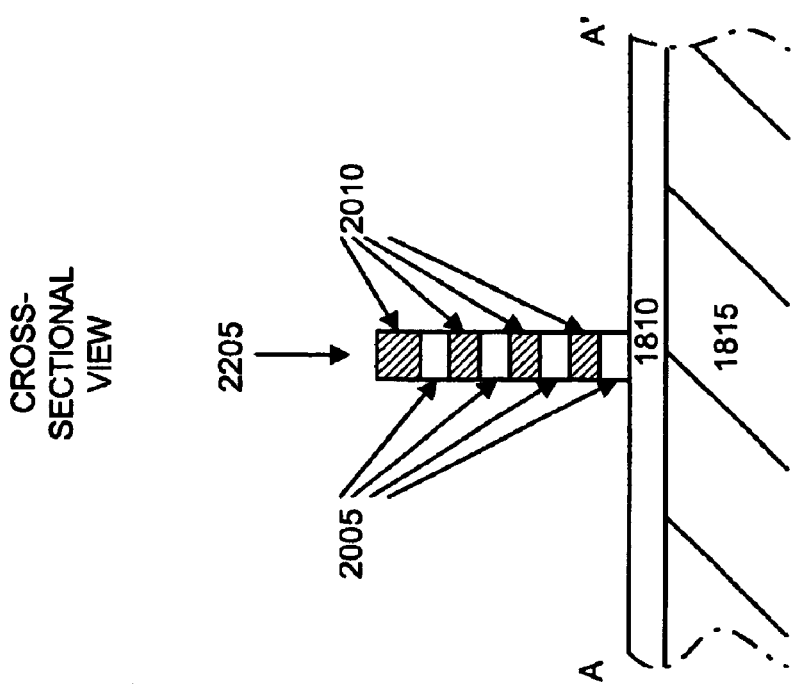
Figure 23B:
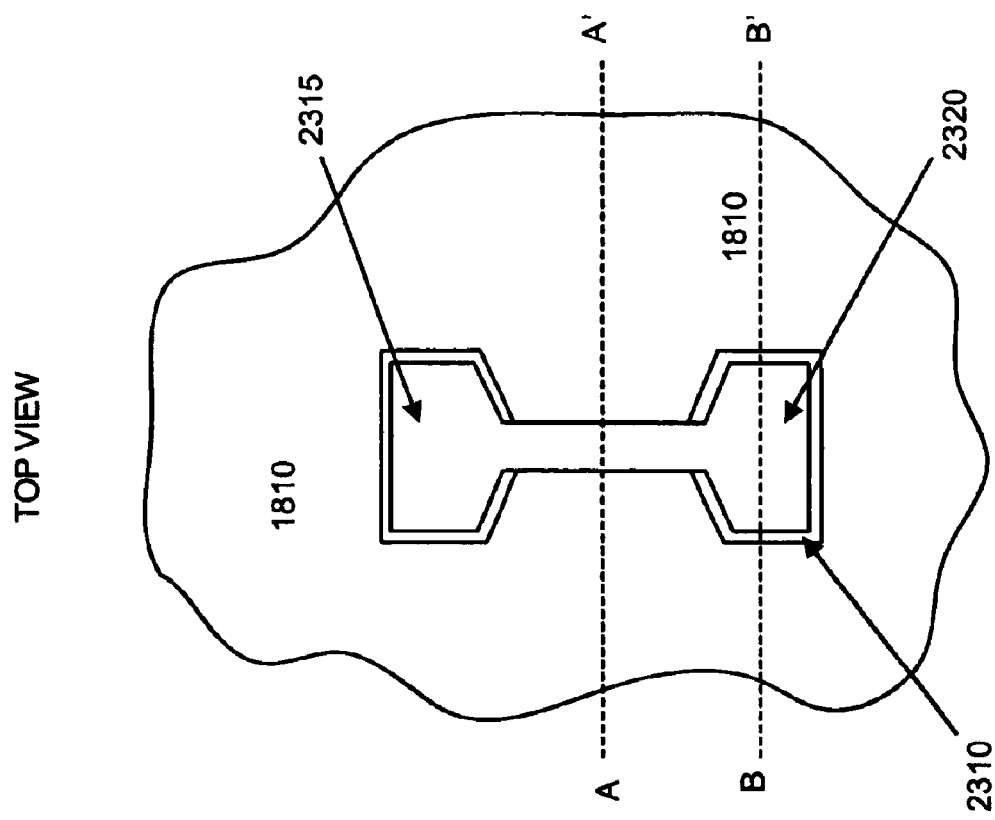
Figure 23A:
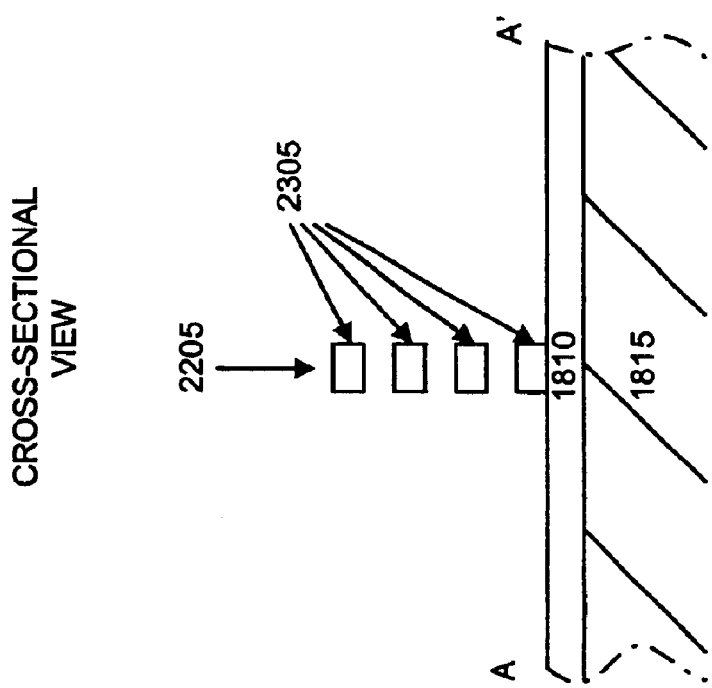

Oxide layer 1805 may be removed using, for example, a conventional etching process to form a fin 2205, as shown in FIGS. 22A and 22B. As further shown in FIGS. 23A, 23B and 23C, material 2005 may be removed using, for example, a conventional wet etching process, to create nano-wires 2305. Etching of material 2005 in fin 2205 may also result in undercutting 2310 of the FinFET source 2315 and drain 2320 regions, as shown in FIGS. 23B and 23C. Each of nano-wires 2305 represents an extremely small channel that can independently contact the eventually formed FinFET gate (not shown).

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:
1. A method of forming a fin field effect transistor, comprising:
   forming a mesa on a silicon-on-insulator wafer;
   forming a dummy gate with a first material in a first pattern over the mesa;
   forming a first dielectric layer around the dummy gate;
   removing the first material to create a trench shaped in the first pattern;
   forming a mask over a portion of the trench and the mesa;

etching a portion of the mesa that is exposed within the trench to form a fin;

forming a gate dielectric layer over the fin;

forming a gate within the trench over the gate dielectric layer; and removing the first dielectric layer.

2. The method of claim 1, wherein the gate contacts at least three surfaces of the fin.

3. The method of claim 2, wherein the fin field effect transistor comprises a tri-gate fin field effect transistor.

4. The method of claim 1, wherein the first dielectric layer comprises tetraethylorthosilicate (TEOS).

5. The method of claim 1, wherein the gate dielectric layer comprises at least one of SiO, $SiO_2$, SiN, SiON, $HFO_2$, $ZrO_2$, $Al_2O_3$, HfSiO(x) and HfSiO(x)N(1−x), wherein x lies between 0 and 1.

6. The method of claim 1, wherein the first material comprises $Si_3N_4$.

7. The method of claim 1, further comprising:

forming a layer of sacrificial oxide over the fin; and removing the sacrificial oxide, prior to forming the gate, to remove defects from sidewalls of the fin.

8. The method of claim 1, wherein forming the gate comprises:

depositing polysilicon within the trench; and polishing the polysilicon to an upper surface of the first dielectric layer to planarize the polysilicon.

9. The method of claim 1, wherein the fin has a rectangular cross-section with a width ranging from about 15 nm to about 30 nm.

10. The method of claim 1, wherein the mesa comprises a silicon layer and an oxide layer formed over the silicon layer.

11. The method of claim 10, wherein a thickness of the silicon layer ranges from about 10 nm to about 50 nm.

12. The method of claim 11, wherein a thickness of the oxide layer ranges from about 10 nm to about 15 nm.

13. The method of claim 1, wherein a thickness of the gate in a channel region of the fin field effect transistor ranges from about 80 nm to about 120 nm.

14. The method of claim 1, wherein the silicon-on-insulator (SOI) wafer is fully depleted SOI wafer and forming the mesa further comprises:

forming a silicon layer, forming a silicon dioxide layer over the silicon layer; and etching the silicon and silicon dioxide layers using a rectangular mask to isolate the mesa.

15. A method of forming a tri-gate fin field effect transistor, comprising:

forming an oxide layer over a silicon-on-insulator wafer comprising a silicon layer;

etching the silicon and oxide layers using a rectangular mask to form a mesa;

etching a portion of the mesa using a second mask to form a fin, wherein the etching a portion of the mesa includes:

etching a portion of the mesa in a channel region of the tri-gate fin field effect transistor;

forming a gate dielectric layer over the fin; and forming a tri-gate over the fin and the gate dielectric layer.

16. The method of claim 15, wherein a thickness of the silicon layer ranges from about 10 nm to about 50 nm.

17. The method of claim 15, wherein a thickness of the oxide layer ranges from about 10 nm to about 15 nm.

18. The method of claim 15, wherein a thickness of the tri-gate in a channel region of the fin field effect transistor ranges from about 80 nm to about 120 nm.

19. The method of claim 15, wherein a width of the fin in the channel region ranges from about 15 nm to about 30 nm.

* * * * *